United States Patent
Soucy et al.

(10) Patent No.: US 8,839,739 B2
(45) Date of Patent: Sep. 23, 2014

(54) MASKING APPARATUS

(75) Inventors: Ronald R. Soucy, Tolland, CT (US);
Anita Rebarchak, Wethersfield, CT (US)

(73) Assignee: United Technologies Corporation, Hartford, CT (US)

( * ) Notice: Subject to any disclaimer, the term of this patent is extended or adjusted under 35 U.S.C. 154(b) by 550 days.

(21) Appl. No.: 12/751,346

(22) Filed: Mar. 31, 2010

(65) Prior Publication Data

US 2011/0239934 A1 Oct. 6, 2011

(51) Int. Cl.
| | |
|---|---|
| B05C 13/00 | (2006.01) |
| C23C 14/04 | (2006.01) |
| B05C 13/02 | (2006.01) |
| C23C 10/04 | (2006.01) |
| C23C 4/00 | (2006.01) |
| F01D 5/28 | (2006.01) |
| F01D 25/28 | (2006.01) |
| B05B 15/04 | (2006.01) |
| B05C 21/00 | (2006.01) |

(52) U.S. Cl.
CPC ........... *B05B 15/045* (2013.01); *B05B 15/0462* (2013.01); *B05C 13/02* (2013.01); *B05C 21/005* (2013.01); *B05C 13/00* (2013.01); *C23C 10/04* (2013.01); *C23C 4/005* (2013.01); *F01D 5/288* (2013.01); F05D 2230/90 (2013.01); *F01D 25/285* (2013.01); *C23C 14/042* (2013.01)

USPC ........... 118/504; 118/500; 118/505; 118/721; 118/730; 427/282

(58) Field of Classification Search
CPC .... B05C 13/02; B05C 21/005; B05B 15/045; B05B 15/0462
USPC ................. 118/504, 500, 505, 721, 720, 730; 427/282
See application file for complete search history.

(56) References Cited

U.S. PATENT DOCUMENTS

| | | | | |
|---|---|---|---|---|
| 5,792,267 A | * | 8/1998 | Marszal et al. | 118/504 |
| 5,849,359 A | * | 12/1998 | Burns et al. | 118/503 |
| 6,391,115 B1 | * | 5/2002 | Marszal et al. | 118/504 |
| 6,863,927 B2 | | 3/2005 | Langley et al. | |
| 7,632,541 B2 | | 12/2009 | Saylor et al. | |
| 2009/0252872 A1 | * | 10/2009 | Saylor et al. | 427/248.1 |

* cited by examiner

*Primary Examiner* — Dah-Wei D Yuan
*Assistant Examiner* — Binu Thomas
(74) *Attorney, Agent, or Firm* — Miller, Matthias & Hull LLP

(57) ABSTRACT

A masking apparatus is provided for masking a workpiece, for example a turbine blade, to protect portions thereof from the deposition of coating material thereon during selective application of a coating material to other portions of the workpiece. The masking apparatus includes an enclosure formed of a first mask half body defining a first cavity half and a second mask half body defining a second cavity half. The first mask half body and the second mask half body mate in assembly to form a workpiece cavity it which the workpiece may be enclosed.

14 Claims, 5 Drawing Sheets

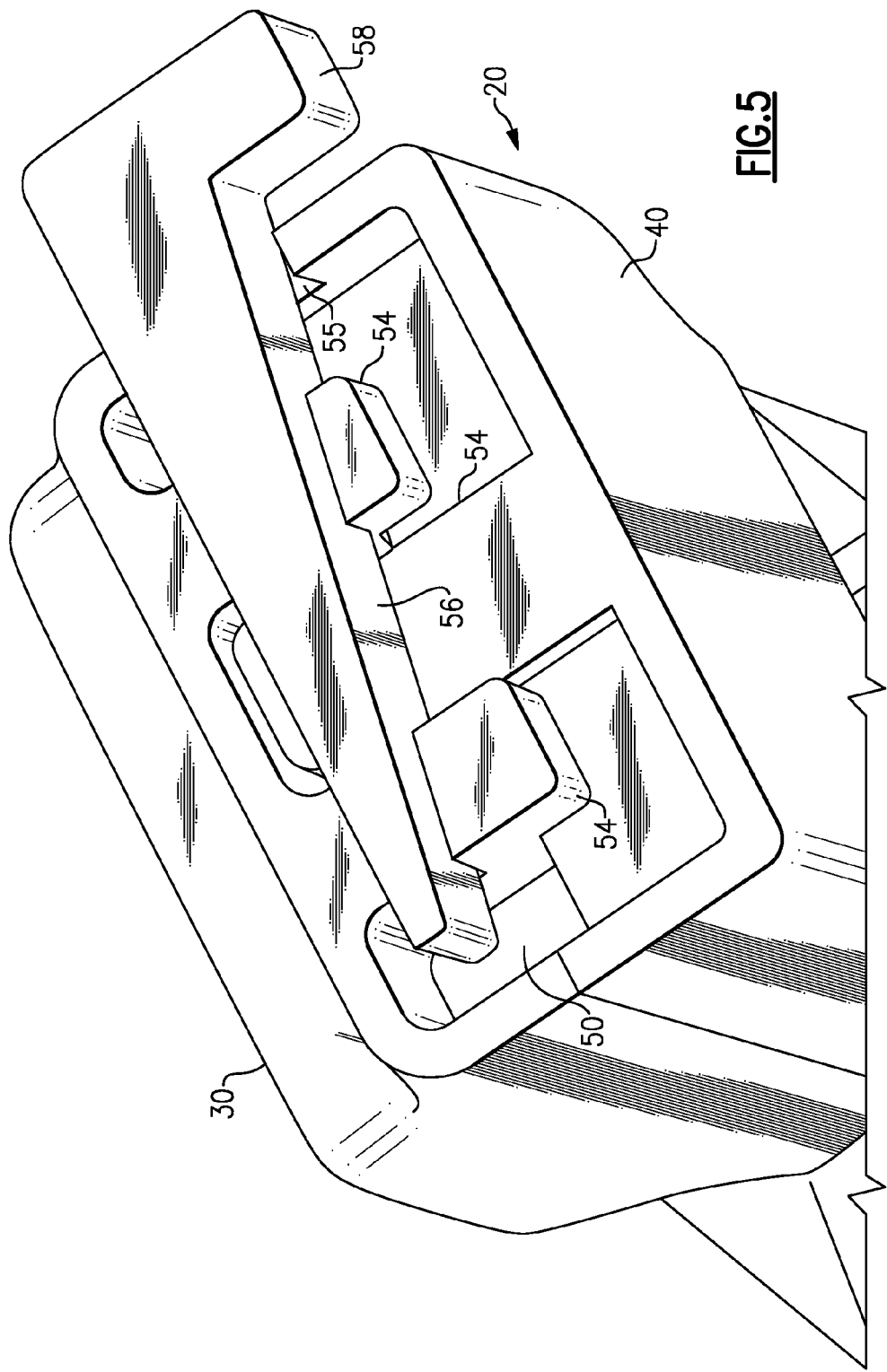

MASKING APPARATUS

FIELD OF THE INVENTION

This invention relates generally to masking of parts during a coating process and, more particularly, to a masking apparatus for shielding portions of a turbine blade from being coated, while a protective coating is deposited upon other portions of the turbine blade.

BACKGROUND OF THE INVENTION

Gas turbine engines, such as those used to power modern aircraft or in industrial applications, include a compressor for pressurizing a supply of air, a combustor for burning a hydrocarbon fuel in the presence of the pressurized air, and a turbine for extracting energy from the resultant combustion gases. Generally, the compressor, combustor and turbine are disposed about a central engine axis with the compressor disposed axially upstream of the combustor and the turbine disposed axially downstream of the combustor. Air drawn into the engine passes axially through the compressor into the combustor wherein fuel is combusted in the air to generate and accelerate combustion gases that pass through the turbine and out the exhaust nozzle of the gas turbine engine. The combustion gases turn the turbine, which turns a shaft in common with the compressor to drive the compressor.

The turbine of the gas turbine engine is generally an axially extending assembly of a plurality of turbine modules mounted to a shaft. Each turbine module may include one or more turbine stages. Each turbine stage includes a row of stationary airfoils, referred to as the stator vanes, and a row of airfoils, referred to as rotor blades, mounted on a rotor disk driven by the airflow passing over the rotor blades. The turbine may include a high pressure turbine including a plurality of high pressure stages in one or more modules assembled to a common shaft with a high pressure compressor, as well as a low pressure turbine including a plurality of low pressure stages in one or more modules assembled to a common shaft with a low pressure compressor and/or fan.

As the hot combustion gases pass through the turbine, various turbine elements are exposed to the hot combustion gases, which may also be corrosive to the material of which those turbine elements are made. Typically, the turbine vanes and turbine blades are made of materials capable of extended operation at high temperatures, such as nickel-based superalloys. In order to protect these turbine elements from oxidation and corrosion due to exposure to the hot combustion gases, it is conventional practice to coat various turbine elements with one or more layers of a protective coating or coatings.

For example, it is known to coat turbine blades for use in gas turbine engines with a protective coating during the process of manufacturing the turbine blades. A difficulty often encountered in the process of coating turbine blades arises from the requirement to coat different portions of the turbine airfoil with different thicknesses of the protective coating and/or with different types of protective coating. Thus, when depositing a protective coating on a selected portion of the turbine blade, it is desirable to protect the remaining portion or portions of the turbine blade from deposition of the protective coating.

One method of protecting a portion of the turbine blade from the deposition of coating material is to mask that portion of the turbine blade with masking tapes, slurries or other coatings. However, doing so is labor-intensive and time consuming. Another method of protecting a portion of the turbine blade from the deposition of coating material is to place the portions of the turbine blade to be protected into a masking enclosure, while leaving only that portion of the turbine blade to be coated exposed to the coating deposition process.

Conventionally, turbine blades include a blade platform, an airfoil portion extending outwardly from an upper face of the platform and a dovetail portion extending outwardly from an under face of the platform. It is customary practice to deposit a desired thickness of a desired protective coating material on the under surface of the blade platform and on the adjacent area of the shank end of the dovetail adjoining the under face of the blade platform. To protect the remainder of the turbine blade during the coating process, the blade is typically placed within a masking enclosure that generally effectively precludes deposition of the coating on the airfoil and dovetail of the blade. The assembly is subjected to a coating process wherein a vapor phase coating, for example an aluminum coating, is deposited only on the under face of the blade platform and the adjacent area of the shank portion of the blade dovetail, which are exposed to the vapor phase coating through one or more openings in the masking enclosure.

In conventional practice, such masking apparatuses for coating application are fabricated by welding metal stock to form the desired geometry for enclosing the turbine blade. However, distortion of the metal stock is inherent in the welding process, making it difficult to achieve the desired the level of accuracy needed to meet engineering requirements for these types of tools. Another shortcoming of fabricating a masking apparatus by welding is the lack of repeatability between such masking apparatuses. As a consequence, the specified coating requirement results may not be achieved, resulting in parts being stripped and recoated till they meet the specified requirements. There is also the risk of parts incorrectly coated to make it by the inspection process since it is difficult to completely determine the coating thickness across a part's surface. Additionally, in such masking apparatuses, the blade is not securely positioned within the masking enclosure. Therefore, the blade may undesirably move laterally within the masking enclosure.

SUMMARY OF THE INVENTION

An apparatus is provided for masking a workpiece to protect portions of the workpiece from the deposition of coating material thereon during selective application of a coating material to other portions of the workpiece. The masking apparatus includes an enclosure defining a cavity for receiving the workpiece. The enclosure is formed of a first mask half body defining a first portion of the workpiece cavity and a second mask half body defining a second portion of the workpiece cavity. A first plurality of mask body locators protrude inwardly from the first mask half body and a second plurality of mask body locators protrude inwardly from said second mask half body. Each of the first plurality of mask body locators and the second plurality of mask body locators abut the workpiece when the first mask half body and the second mask half body are assembled to form the enclosure about the workpiece. In an embodiment, at least one locking tab may be provided in association with the first mask half body and at least one locking tab may be provided in association with said second mask half body; and a locking member may be provided for engaging with the at least one locking tab of the first mask half body and with the at least one locking tab of the second mask half body.

Also provided is an embodiment of the apparatus adapted for masking a portion of a gas turbine blade to be protected against coating during the application of a coating material to a selected area of the blade. The masking apparatus includes: a first mask half body defining a first cavity for receiving an airfoil portion of the blade and a second cavity for receiving a dovetail portion of the blade, a second mask half body defining a first cavity for receiving the airfoil portion of the blade and a second cavity for receiving the dovetail portion of the blade, a plurality of body locators protruding inwardly from the first mask half body and positioned to abut a plurality of first selected locations on the blade; and a plurality of body locators protruding inwardly from the second mask half body and positioned to abut a plurality of second selected location on the blade. The first mask half body also includes an opening for providing access for coating deposition on a first selected surface of the blade and the second mask half body includes an opening for providing access for coating deposition on a second selected surface of the blade.

In an embodiment, the first mask half body has a perimeter wall including an outwardly projecting first shiplap and the second mask half body has a perimeter wall including an outwardly projecting second shiplap. The first shiplap and the second shiplap in cooperation entombment of the enclosure when the first mask half body and the second mask half body are mated in assembly.

In an embodiment, a lock pocket is formed when the first mask half body and the second mask half are assembled. The lock pocket is formed externally of the first and second cavities of the assembled enclosure. A locking member is inserted within the lock pocket for locking the first mask half body and the second mask half body together. The locking member may comprise an elongated wedge-shaped member.

In an embodiment, a guide pin and guide pin receptacle may be provided, wherein the guide pin protrudes outwardly from one of the first mask half body and the second mask half body, and the guide pin receptacle is formed in the other of the first mask half body and the second mask half body. The guide pin is received within the guide pin receptacle when the first mask half body and the second mask half body are mated in assembly.

BRIEF DESCRIPTION OF THE DRAWINGS

For a further understanding of the disclosure, reference will be made to the following detailed description which is to be read in connection with the accompanying drawing, wherein:

FIG. 5 is a perspective view, partly in section, taken along line 5-5 of FIG. 1; and FIG. 6. is a side elevation view of an exemplary embodiment of the locking member associated with the masking apparatus.

DETAILED DESCRIPTION OF THE INVENTION

Figure 1:
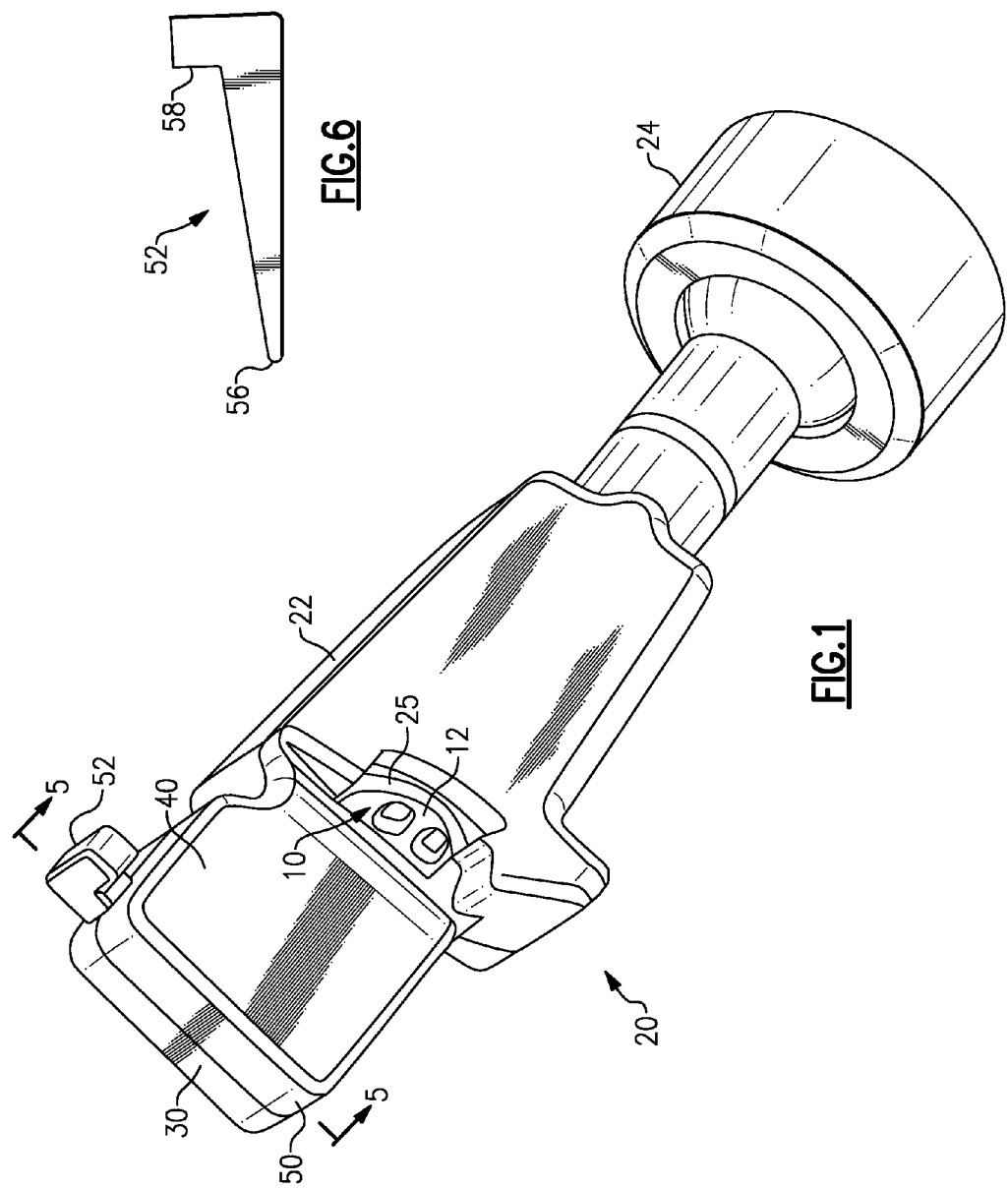
FIG. 1 is an exemplary embodiment of a masking apparatus for enclosing a turbine blade during a selective application of coating material.
Figure 2:
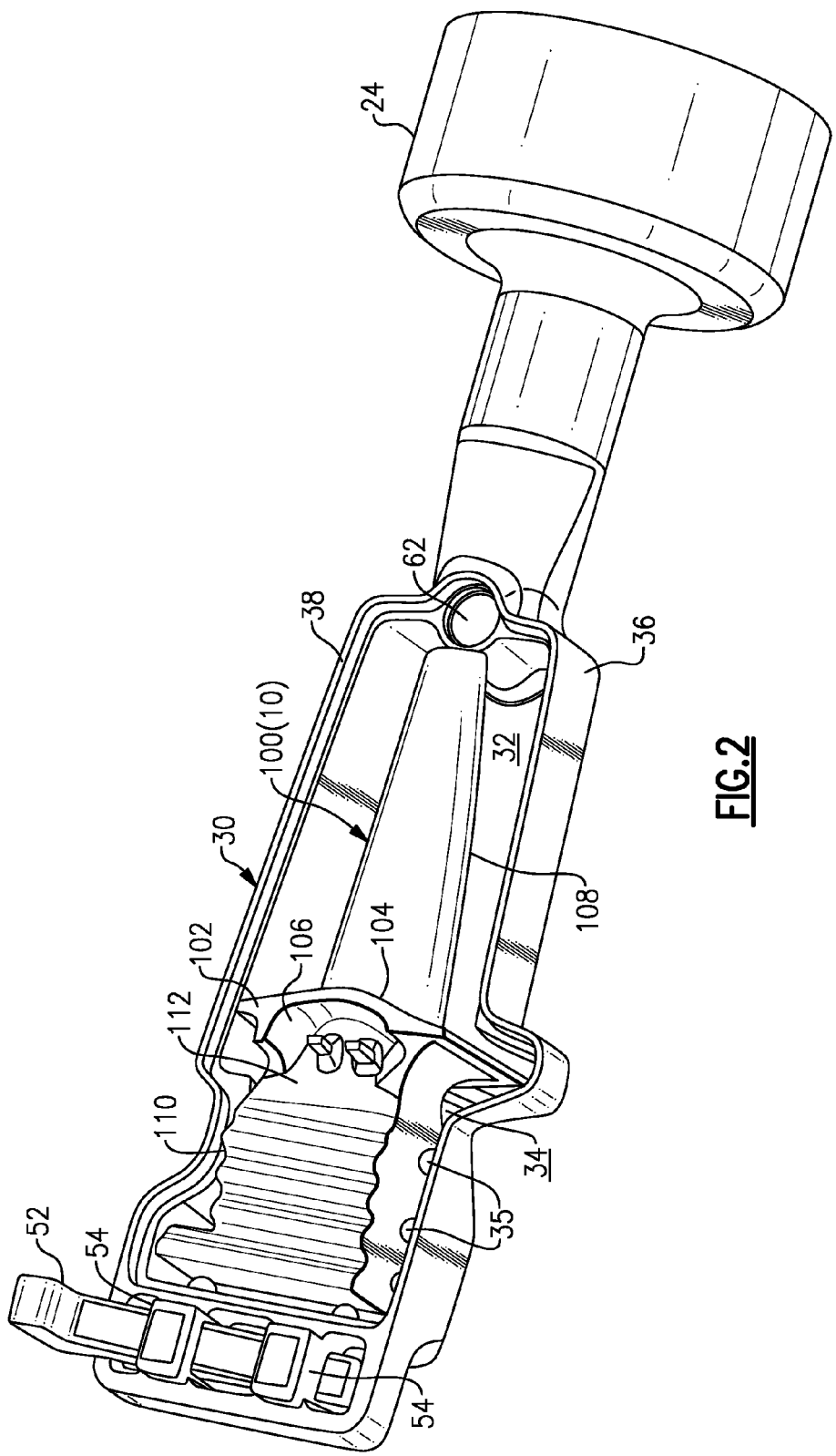
FIG. 2 is a perspective view of one mask half body showing a turbine blade received within the cavity of the mask half body.

Referring initially to FIGS. 1 and 2 of the drawing, there is depicted an exemplary embodiment of a masking apparatus 20, also commonly referred to as a masking tool, for protecting a workpiece 10 enclosed therein during the application of a coating material to a selected area 12 of the workpiece 10. The coating material may be applied, for example by spray deposition or other suitable application technique, to the selected area 12 through an opening 25 in the enclosure 22 of the masking apparatus 20 that exposes only the selected area 12. The remaining portion of the workpiece 10 entombed within the interior of the masking apparatus 20 is protected from the deposition of coating material thereon during the process of applying the coating material to the selected area 12. The masking apparatus 20 may also include a tooling fixture 24 that extends longitudinally outward from the enclosure 22 for handling of the masking apparatus 20 and mounting of the masking apparatus 20 in a tooling jig (not shown).

The enclosure 22 defines a workpiece cavity internally therein for entombing the workpiece 10 during application of the coating material and a locking pocket sealed from the workpiece cavity. The enclosure 22 is formed of a longitudinally extending first mask half body 30 defining a first cavity half and a first pocket half and a longitudinally extending second mask half body 40 defining a second cavity half and a second pocket half. The first mask half body 30 and the second mask half body 40 mate in assembly to form the workpiece cavity and the locking pocket. As will be described in further detail hereinafter, a locking member 52 may be inserted into the locking pocket 50 and engaged with at least one locking tab (not shown in FIG. 1) of the first mask half body 30 and also at least one locking tab (not shown in FIG. 1) of the second mask half body 40 thereby holding the first mask half body 30 and the second mask half body 40 mated in assembly.

Each of the first and second mask half bodies 30, 40 may be fabricated by casting a suitable material into a mold whereby the respective cavity thereof may be contoured to reflect the portion of the workpiece 10 to be disposed within that respective cavity. The masking apparatus 20 is intended for repeated use. Therefore, the material of which the mask half bodies 30, 40 are formed must be capable of exposure to the temperature and operating conditions encountered in the coating process without degrading.

Figure 3:
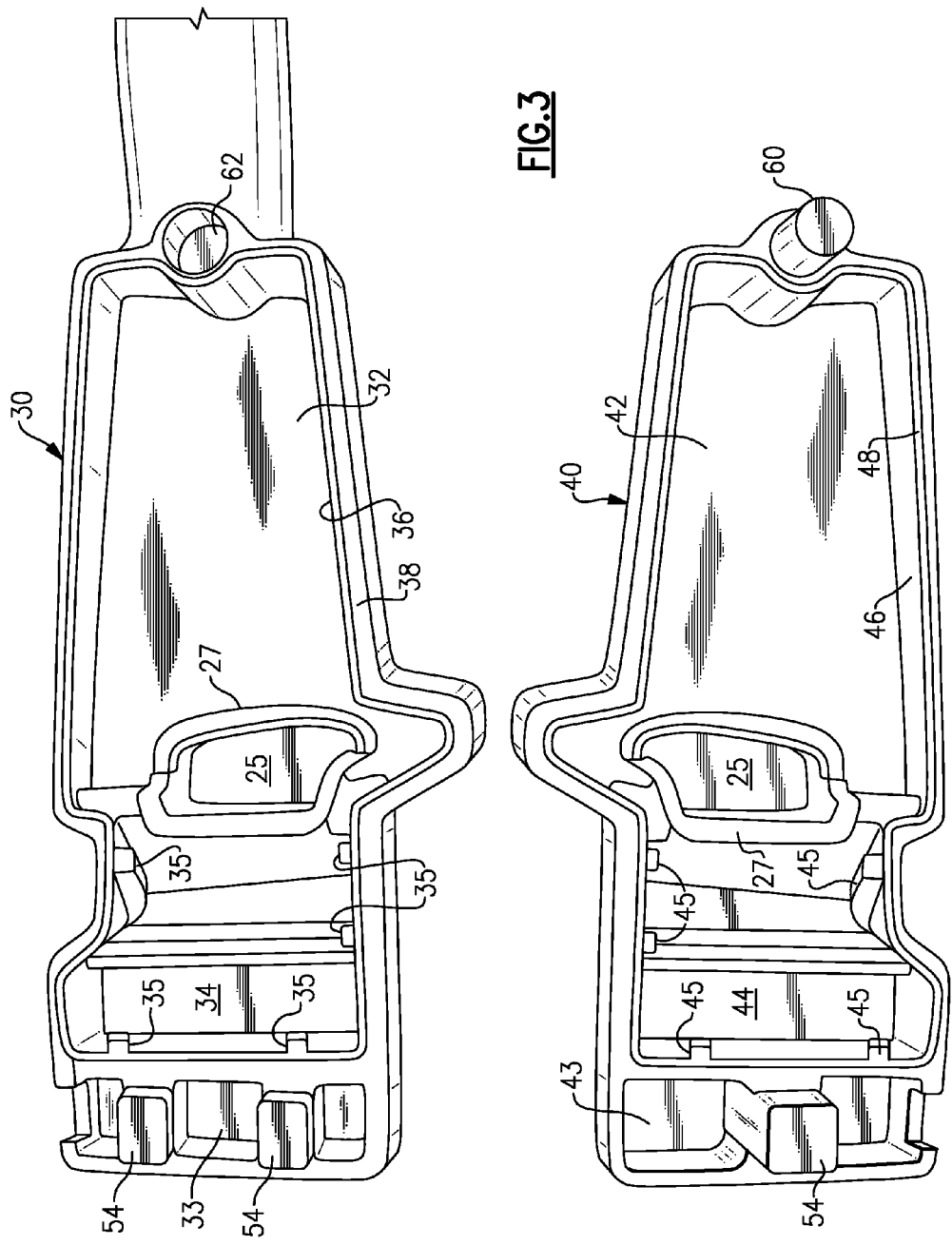
FIG. 3. is a plan view of the masking apparatus of FIG. 1 shown in an open configuration prior to assembly of the two mask half bodies.
Figure 4:
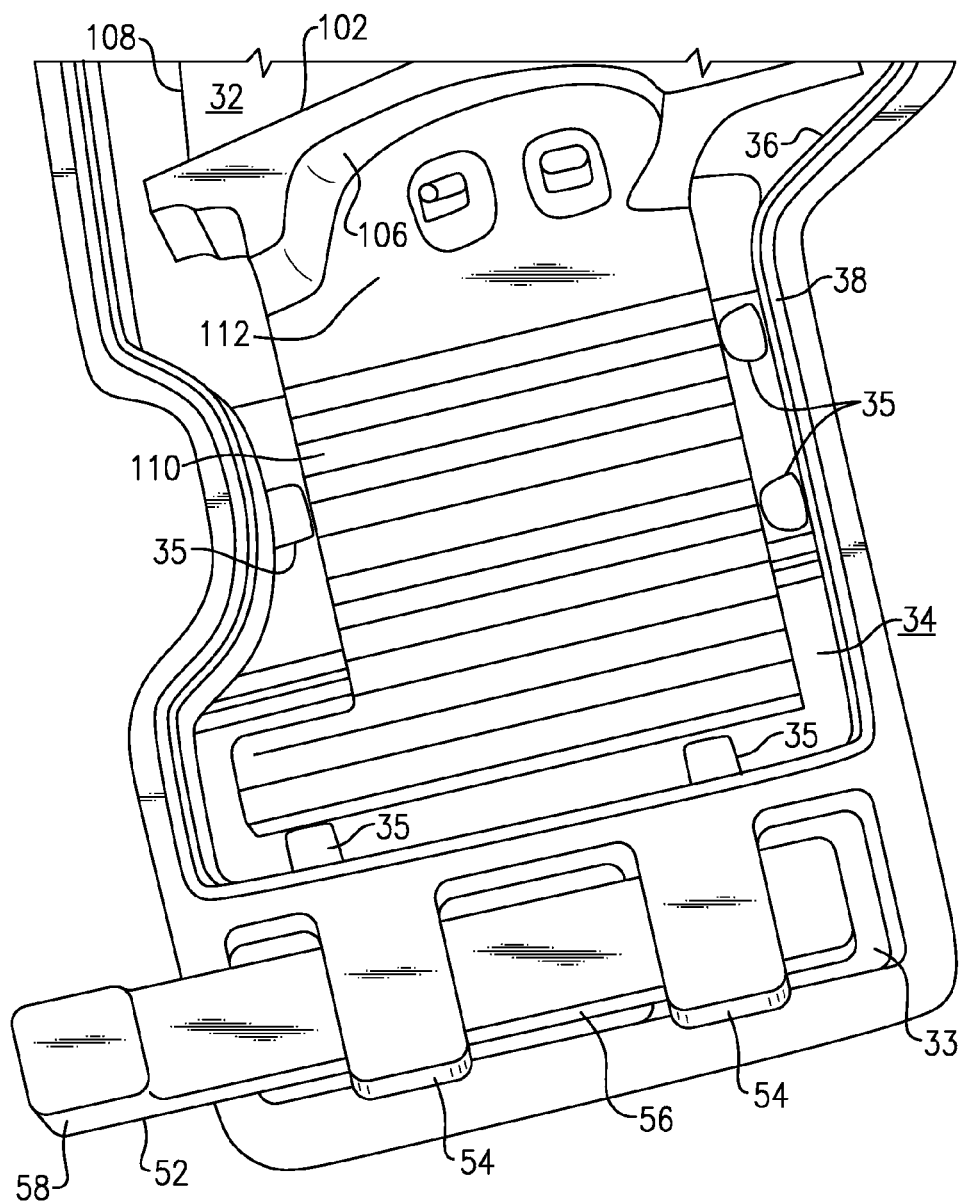
FIG. 4 is an enlarged plan view of the locking chamber and second cavity of the mask half body shown in FIG. 2.

The masking apparatus 20 will be described further herein with reference to the exemplary embodiment depicted in FIGS. 2-5, wherein a turbine blade 100 constitutes the workpiece 10 that is positioned within the masking apparatus 20. In FIG. 2, the turbine blade 100 is shown positioned within the first mask half body 30. In FIG. 3, the enclosure 22 of the masking apparatus 20 is shown in an open configuration with the first mask half body 30 and the second mask half body 40 lying side by side prior to assembly. The turbine blade 100 has a blade platform 102 having an upper surface 104 and an under surface 106, an airfoil portion 108 extending outwardly from the face surface 104 of the blade platform 102, a dovetail portion 110 extending outwardly from the blade platform 102 opposite the airfoil portion 108, and a shank 112 extending from the under surface 106 of the blade platform 102 and connecting to and formed integrally with the dovetail portion 110.

The first mask half body 30 defines an open first cavity 32 for receiving the airfoil portion 108 of the gas turbine blade 100 and an open second cavity 34 for receiving the dovetail portion 110 of the gas turbine blade 100. Similarly, the second mask half body 40 defines an open first cavity 42 for receiving the airfoil portion 108 of the gas turbine blade 100 and an open second cavity 44 for receiving the dovetail portion 110 of the gas turbine blade 100. The first mask half body 30 and the second mask half body 40 mate in assembly to entomb the airfoil portion 108 of the gas turbine blade 100 within the first cavities 32, 42 of the first mask half body 30 and the second mask half body 40, respectively, and to also entomb the dovetail portion 110 of the gas turbine blade 100 within the second cavities 34, 44 of the first mask half body 30 and the second mask half body 40, respectively. Prior to assembly of the first and second mask half bodies 30, 40 to form the enclosure 22, the turbine blade 100 is positioned within either one of the first mask half body or the second mask half body 40. For example, as illustrated in FIG. 2, the turbine blade 100 may be positioned within the first mask half body 40 with the airfoil portion 108 of the turbine blade 100 disposed in the first cavity 32 and the dovetail portion 110 of the turbine blade 100 disposed in the second cavity 34.

Each of the first mask half body 30 and the second mask half body 40 includes an opening 25 therein that opens into the interior space within the enclosure 22 at the interface of the respective first cavities 32, 42 and the respective second cavities 34, 44. The openings 25 in the first mask half body 30 and the second mask half body 40 define "coating windows" that provide access for selectively applying coating material on an area under the blade platform 102 and an adjacent area of the shank 112 of the turbine blade 100. An internal lip 27 extends around the perimeter of and defines each opening 25. The internal lips 27 abut against the enclosed turbine blade 100 to seal the first cavities 32, 42 and the second cavities 34, 44 from the opening 25. It is to be understood, however, that in other adaptations of the coating apparatus 20 disclosed herein, the openings 25 may be positioned in other locations to provide "coating windows" for providing access to selectively deposit coating material on a selected area of the workpiece 10, while protecting the remainder of the workpiece 10 from deposition of coating material thereon.

The first mask half body 30 includes a plurality of first mask half body locators 35, each of which protrudes inwardly from the inner side of the wall 36 of the first mask half body 30. Similarly, the second mask half body 40 includes a plurality of second mask half body locators 45, each of which protrudes inwardly from the inner side of the wall 46 of the second mask half body 40. In the depicted embodiment, a plurality of first mask half body locators 35 protrude inwardly along the inner perimeter of the wall 36 about the second cavity 34. Similarly, a plurality of second mask half body locators 45 protrude inwardly along the inner perimeter of the wall 46 about the second cavity 44. Each of the first mask half body locators 35 and the second mask half body locators 45 is positioned to abut a respective selected location on the turbine blade 100 when the first mask half body 30 and the second mask half body 40 are mated in assembly.

The first and second mask half body locators 35, 45 serve not only to consistently properly locate the dovetail portion 110 of the turbine blade 100 within the second cavities 34, 44, respectively, but also to consistently locate the first mask half body 30 and the second mask half body 40 relative to each other during the step of assembly of the two mask half bodies 30, 40 together. Because each of the first and second mask half bodies 30, 40 are located by means of the respective locators 35, 45 directly off the turbine blade 100 itself (rather than one mask half body off the other mask half body), an accurate alignment of the first and second mask half bodies 30, 40 during assembly is assured from blade to blade and from tool to tool. The locators 35, 45 may be formed integrally with the mask half bodies 30, 40, respectively, during the casting process or may be separately secured thereto, for example by welding or bonding. In the latter case, the locators 35, 45, may be made of a different material than the mask half bodies, for example a material that would be more compatible with the workpiece when in contact therewith.

To further facilitate assembly of the first and second mask half bodies 30, 40, a guide pin 60 and guide pin receptacle 62 may be provided, wherein the guide pin 60 protrudes outwardly from one of the first mask half body 30 and the second mask half body 40, and the guide pin receptacle 62 is formed in the other of the first mask half body 30 and the second mask half body 40. The guide pin 60 is received within the guide pin receptacle 62 when mating the first mask half body 30 and the second mask half body 40 together. As illustrated in FIG. 3, the guide pin 60 may protrude outwardly from the face of the perimeter wall 36 of the first mask half body 30 and the guide pin receptacle 62 may be a recess formed the face of the perimeter wall 46 of the second mask half body 40. In the depicted embodiment, the guide pin 60 and the guide pin receptacle 62 are located in the perimeter walls 36, 46, respectively, outboard of the first cavities 32, 42 of the first and second mask half bodies 30, 40, respectively.

At least one of the first mask half body 30 and the second mask half body 40 (and both as depicted in FIG. 3) may be provided with a shiplap 38, 48 projecting outwardly from and extending along substantially the entire perimeter wall 36, 46 of the mask half body 30, 40. For example, as best seen in FIG. 3, the perimeter wall 36 of the first mask half body 30 may include an outwardly projecting first shiplap 38 that extends along the outer edge of substantially the entire perimeter wall 36 of the first mask half body 30, and the perimeter wall 46 of the second mask half body 40 may include an outwardly projecting second shiplap 48 that extends along the inner edge of substantially the entire perimeter wall 46 of the second mask half body 40. Thus, the first shiplap 38 and the second shiplap 48 lie in side-by-side relationship about the perimeter of the mask body 20 when the first mask half body 30 and the second mask half body 40 are mated in assembly with the turbine blade 100 entombed within the mask body 20. However, enough space may be provided between the mating shiplaps 38, 48 to enable the separate mask half bodies 30, 40 to independently be located off the turbine blade 100 while ensuring that a complete enclosure of the turbine blade 100 is maintained.

As mentioned previously, the first mask half body 30 and the second mask half body 40 are held in mating assembly about the turbine blade 100 by a locking member 52 inserted into the locking pocket 50. The first mask half body 30 includes a first half pocket 33 disposed at the base end thereof outboard of the second cavity 34. Similarly, the second mask half body 40 includes a second half pocket 43 disposed at the base end thereof outboard of the second cavity 44. When the first and second mask half bodies 30, 40 are mated in assembly as depicted in FIG. 2, the first half pocket 33 and the second half pocket 43 mate to form the locking pocket 50 into which the looking member 52 is inserted.

Referring now to FIGS. 2-5, at least one locking tab 54 may be provided within the first half pocket 33 of the first mask half body 30. At least one locking tab 54 may also be provided within the second half pocket 43 of the first mask half body 40. Each locking tab 54 defines an opening for receiving the locking member 52 and is adapted to engage a respective portion of the locking member 52 when the locking member 52 is inserted within the locking pocket 50. Each locking tab 54 may be formed integrally with the respective mask half body 30, 40 in which it is disposed or may be constitute a separate member welded or otherwise bonded to and extending between the perimeter wall of the respective mask half body 30, 40 in which it is disposed and the wall that separates the respective second cavity 34, 44 from the respective half pocket 33, 43.

As illustrated in FIG. 3, a pair of locking tabs 54 in the first mask half body 30 are spaced laterally apart from each other within the first half pocket 33, while a single locking tab 54 in the second mask half body 40 is disposed within the second half pocket 43 intermediate the pair of locking tabs 54 of the first mask half body 30. As best seen in FIG. 5, when the first and second mask half bodies 30, 40 are mated in assembly, the single locking tab 54 of the second mask half body 40 is positioned between the spaced pair of locking tabs 54 of the first mask half body 30. When the locking member 52 is inserted into the locking pocket 50 a keyway opening 55 provided in a side wall of the locking pocket 50 of the assembled masking apparatus 20, the locking member 52 passes in succession through each of the respective openings defined by the locking tabs 54 until each locking tab 54 engages a respective portion of the locking member 52.

The locking member 52 may include a longitudinally extending wedge member 56 extending from a handle 58 as illustrated in FIGS. 5 and 6. When the locking member 52 is fully inserted into the locking pocket 50, the wedge member 56 is received in succession within each of the locking tabs 54. So positioned, a first portion of the wedge member 56 at the thinner end of the wedge member 56 is engaged with a first of the locking tabs 54 of the first mask half body 30, a second portion of the wedge member 56 in the midspan of the wedge member 56 is engaged the single locking tab 54 of the second mask half body 40, and a third portion of the wedge member 56 at the thicker end of the wedge member 56 is engaged with a second of the locking tabs 54 of the first mask half body 30, thereby tightening one mask half body to the other and locking the first and second mask half bodies 30, 40 in assembly. The handle 58 of the locking member 52 remains disposed externally of the masking apparatus 20 when the wedge member 56 of the locking member 52 is fully received within the locking pocket 50 and engaged with each of the locking tabs 54. The wedge shape of the wedge member 56 simplifies securing the two mask half bodies to each other and to the workpiece being coated. Additionally, an integral lock is embedded within the masking apparatus itself, but externally of either of the cavities enclosing the turbine blade.

The terminology used herein is for the purpose of description, not limitation. Specific structural and functional details disclosed herein are not to be interpreted as limiting, but merely as basis for teaching one skilled in the art to employ the present invention. Those skilled in the art will also recognize the equivalents that may be substituted for elements described with reference to the exemplary embodiments disclosed herein without departing from the scope of the present invention.

While the present invention has been particularly shown and described with reference to the exemplary embodiment as illustrated in the drawing, it will be recognized by those skilled in the art that various modifications may be made without departing from the spirit and scope of the invention. Therefore, it is intended that the present disclosure not be limited to the particular embodiment disclosed, but that the disclosure will include all embodiments falling within the scope of the appended claims.

We claim:

1. An apparatus for masking a workpiece during selective application of a coating material, the masking apparatus comprising:
    an enclosure defining a cavity for receiving the entire workpiece, said enclosure formed of a first mask half body defining a first portion of the workpiece cavity and a second mask half body defining a second portion of the workpiece cavity, a guide pin projecting outwardly from said first mask half body and a guide pin receptacle formed in said second mask half body;
    a first plurality of mask body locators protruding inwardly from said first mask half body and a second plurality of mask body locators protruding inwardly from said second mask half body, each of the first plurality of mask body locators and the second plurality of mask body locators abutting the workpiece when said first mask half body and said second mask half body are assembled.

2. The apparatus as recited in claim 1 wherein the first plurality of mask body locators are formed integrally with said first mask half body and the second plurality of mask body locators are formed integrally with said second mask half body.

3. The apparatus as recited in claim 1 wherein each first mask body locator is positioned to abut a corresponding first selected location on the workpiece when the first mask half body and the second mask half body are assembled, and each second mask body locator is positioned to abut corresponding a second selected location on the workpiece when the first mask half body and the second mask half body are mated in assembly.

4. The apparatus as recited in claim 1 further comprising at least one locking tab associated with said first mask half body and at least one locking tab associated with said second mask half body; and a locking member for engaging with the at least one locking tab of said first mask half body and with the at least one locking tab of said second mask half body.

5. The apparatus as recited in claim 4 wherein said locking member comprises an elongated wedge-shaped member.

6. An apparatus for masking a portion of a gas turbine blade to be protected against coating during application of a coating material to a selected area of the gas turbine blade, the masking apparatus comprising:
    a first mask half body defining a first cavity for receiving an airfoil portion of the gas turbine blade and a second cavity for receiving a dovetail portion of the gas turbine blade;
    a second mask half body defining a first cavity for receiving the airfoil portion of the gas turbine blade and a second cavity for receiving the dovetail portion of the gas turbine blade;
    a plurality of body locators protruding inwardly from the first mask half body, the plurality of body locators positioned to abut a plurality of first selected locations on the gas turbine blade; and
    a plurality of body locators protruding inwardly from the second mask half body, the plurality of body locators positioned to abut a plurality of second selected location on the gas turbine blade, the plurality of body locators locating the first mask half body and the second mask half body relative to each other when the first mask half body and the second mask half body are assembled.

7. An apparatus as recited in claim 6 wherein:
    said first mask half body includes an opening providing access for coating deposition on a first selected surface of the gas turbine blade; and
    said second mask half body includes an opening providing access for coating deposition on a second selected surface of the gas turbine blade.

8. An apparatus as recited in claim 7 wherein the openings in said first mask half body and said second mask half body provide access to selectively apply coating material unto an under side of a blade platform of the gas turbine blade and an adjacent area of a shank of the gas turbine blade.

9. An apparatus as recited in claim 6 wherein:
said first mask half body has a perimeter wall including an outwardly projecting first shiplap and said second mask half body has a perimeter wall including an outwardly projecting second shiplap, the first shiplap and the second shiplap in cooperation sealing the first cavities and the second cavities when said first mask half body and said second mask half body are mated in assembly.

10. An apparatus as recited in claim 6 wherein said first mask half body further includes a first lock cavity disposed externally of the first and second cavities and said second mask half body further includes a second lock cavity disposed externally of the first and second cavities, the first lock cavity and the second lock cavity forming a lock pocket when said first body mask and said second body mask are mated in assembly.

11. An apparatus as recited in claim 10 further comprising a locking member inserted within said lock pocket for locking said first mask half body and said second mask half body together.

12. An apparatus as recited in claim 11 wherein said first lock cavity includes at least one locking tab for engaging said locking member and said second lock cavity includes at least one locking tab for engaging said locking member.

13. An apparatus as recited in claim 11 wherein said locking member comprises an elongated wedge-shaped member.

14. An apparatus as recited in claim 6 further comprising:
a guide pin protruding outwardly from one of said first mask half body or said second mask half body; and
a guide pin receptacle formed in the other of said first mask half body or said second mask half body, the guide pin received within the guide pin receptacle when said first mask half body and said second mask half body are assembled.

\* \* \* \* \*